United States Patent
Li et al.

(10) Patent No.: US 12,146,085 B2
(45) Date of Patent: Nov. 19, 2024

(54) MULTIPHASE FLUORESCENT CERAMIC AND PREPARATION METHOD THEREOF

(71) Applicant: APPOTRONICS CORPORATION LIMITED, Guangdong (CN)

(72) Inventors: Qian Li, Guangdong (CN); Shuai Jian, Guangdong (CN); Yangang Wang, Guangdong (CN); Yi Li, Guangdong (CN)

(73) Assignee: APPOTRONICS CORPORATION LIMITED, Guangdong (CN)

(*) Notice: Subject to any disclaimer, the term of this patent is extended or adjusted under 35 U.S.C. 154(b) by 700 days.

(21) Appl. No.: 17/423,092

(22) PCT Filed: Dec. 23, 2019

(86) PCT No.: PCT/CN2019/127262
§ 371 (c)(1),
(2) Date: Feb. 1, 2022

(87) PCT Pub. No.: WO2020/147516
PCT Pub. Date: Jul. 23, 2020

(65) Prior Publication Data
US 2022/0154068 A1   May 19, 2022

(30) Foreign Application Priority Data
Jan. 14, 2019   (CN) .......................... 201910032864.4

(51) Int. Cl.
*C09K 11/02* (2006.01)
*C04B 35/117* (2006.01)
(Continued)

(52) U.S. Cl.
CPC ............ *C09K 11/02* (2013.01); *C04B 35/117* (2013.01); *C04B 35/6261* (2013.01); *C04B 35/638* (2013.01); *C04B 35/64* (2013.01); *C09K 11/7774* (2013.01); *C04B 2235/3222* (2013.01); *C04B 2235/5445* (2013.01);
(Continued)

(58) Field of Classification Search
CPC ... C09K 11/02; C09K 11/7774; C04B 35/117; C04B 35/6261; C04B 35/638; C04B 35/64; C04B 2235/3222; C04B 2235/3445; C04B 2235/604; C04B 2235/763; C04B 2235/85
See application file for complete search history.

(56) References Cited

FOREIGN PATENT DOCUMENTS

| CN | 102324424 A | 1/2012 |
|---|---|---|
| CN | 102428030 A | 4/2012 |

(Continued)

OTHER PUBLICATIONS

Translation for CN 107540368, Jan. 5, 2018 (Year: 2018).*
(Continued)

*Primary Examiner* — C Melissa Koslow
(74) *Attorney, Agent, or Firm* — McCoy Russell LLP

(57) ABSTRACT

A multiphase fluorescent ceramic and a preparation method therefor. Spinel is provided in a multiphase fluorescent ceramic including an alumina matrix and fluorescent particles, the spinel is distributed between alumina grain boundaries, and the exciting light irradiated into the multiphase fluorescent ceramic can be scattered, thereby facilitating further improvement in the luminous efficiency of the multiphase fluorescent ceramic.

20 Claims, 4 Drawing Sheets

Proportioning and then Mixing Powders of an Alumina, a Magnesium-Containing Compound, and Fluorescent Particles, and Pressing Obtained Mixture into a Green Body Block — S41

Sintering the Green Body Block so that the Magnesium-Containing Compound Reacts with the Alumina to Form an Aluminum-Magnesium Spinel, thereby Forming the Multiphase Fluorescent Ceramic Comprising an Alumina Matrix, and the Fluorescent Particles and the Aluminum-Magnesium Spinel which are Distributed in the Alumina Matrix — S42

(51) Int. Cl.
*C04B 35/626* (2006.01)
*C04B 35/638* (2006.01)
*C04B 35/64* (2006.01)
*C09K 11/77* (2006.01)

(52) U.S. Cl.
CPC .. *C04B 2235/604* (2013.01); *C04B 2235/763* (2013.01); *C04B 2235/85* (2013.01); *C04B 2235/9661* (2013.01)

(56) References Cited

FOREIGN PATENT DOCUMENTS

| | | | |
|---|---|---|---|
| CN | 105294138 A | | 2/2016 |
| CN | 107285745 A | | 10/2017 |
| CN | 107285746 A | | 10/2017 |
| CN | 107540368 | * | 1/2018 |
| CN | 107540368 A | | 1/2018 |
| CN | 108069710 A | | 5/2018 |
| JP | 2011222751 A | | 11/2011 |
| WO | 2016135057 A1 | | 9/2016 |

OTHER PUBLICATIONS

State Intellectual Property Office of the People's Republic of China, Office Action and Search Report Issued in Application No. 201910032864.4, May 7, 2022, 14 pages. (Submitted with Partial Translation).
ISA China National Intellectual Property Administration, International Search Report Issued in Application No. PCT/CN2019/127262, Mar. 13, 2020, WIPO, 6 pages.

* cited by examiner

MULTIPHASE FLUORESCENT CERAMIC AND PREPARATION METHOD THEREOF

CROSS REFERENCE TO RELATED APPLICATIONS

The present application is a U.S. National Phase of International Application No. PCT/CN2019/127262 entitled "MULTIPHASE FLUORESCENT CERAMIC AND PREPARATION METHOD THEREFOR," and filed on Dec. 23, 2019. International Application No. PCT/CN2019/127262 claims priority to Chinese Patent Application No. 201910032864.4 filed on Jan. 14, 2019. The entire contents of each of the above-listed applications are hereby incorporated by reference for all purposes.

TECHNICAL FIELD

The present disclosure relates to the technical field of solid-state illuminating, and in particular, to a multiphase fluorescent ceramic and a preparation method thereof.

BACKGROUND

At present, laser illumination display technology mainly uses blue laser to excite fluorescent materials to obtain fluorescence in other wavelength bands. With the continuous development of laser illumination display technology, the requirements on the performances of the fluorescent materials are also continuously increasing. For example, it is required that the fluorescent materials have a higher light conversion efficiency, a higher luminous brightness and a higher thermal conductivity so as to carry blue laser with a higher power density.

SUMMARY

In view of this, it is necessary for the present disclosure to provide a multiphase fluorescent ceramic and a preparation method thereof, so as to further improve the luminous efficiency.

The present disclosure provides a multiphase fluorescent ceramic, the multiphase fluorescent ceramic includes an alumina matrix, and fluorescent particles and aluminum-magnesium spinel which are distributed in the alumina matrix, and the aluminum-magnesium spinel is distributed between alumina grain boundaries in the alumina matrix.

The present disclosure provides a preparation method of a multiphase fluorescent ceramic, the preparation method includes powders of an alumina, a magnesium-containing compound, and fluorescent particles are proportioned and then mixed, and the obtained mixture is pressed into a green body block; and the green body block is sintered so that the magnesium-containing compound reacts with the alumina to form an aluminum-magnesium spinel, thereby forming the multiphase fluorescent ceramic comprising an alumina matrix, and the fluorescent particles and the aluminum-magnesium spinel which are distributed in the alumina matrix.

According to the multiphase fluorescent ceramic and the preparation method thereof provided in the present disclosure, spinel is provided in the multiphase fluorescent ceramic including an alumina matrix and fluorescent particles. The spinel is distributed between the alumina grain boundaries and has a refractive index lower than that of the alumina matrix, and thus can scatter the excitation light irradiated into the multiphase fluorescent ceramic, which is beneficial to further improve the luminous efficiency of the multiphase fluorescent ceramic.

DETAILED DESCRIPTION

Fluorescent materials used in the laser illumination display technology can be roughly divided into three categories. One category is fluorescent materials formed by encapsulating fluorescent powder through organic polymers such as organic silica gel/organic resin. With the increase of the power of the blue laser, the heat generated by the fluorescent powder encapsulated by the organic matrix increases sharply in the light conversion process, causing the temperature of the fluorescent material itself to rise sharply, resulting in aging and yellowing of the organic matrix, resulting in the problems of loss of luminous efficiency and reduced lifespan. A second category is fluorescent glass mainly formed by encapsulating the fluorescent powder in $SiO_2$-based/borosilicate-based inorganic glass. Compared with the organic resin, the fluorescent glass has great improvements in heat resistance, high thermal stability, low color cast and other performances, but the thermal conductivity thereof is not significantly improved compared to the organic resin. A third category is a fluorescent ceramic. Compared with fluorescent materials encapsulated by the organic matrix and the inorganic glass matrix, the fluorescent ceramics have significant advantages in terms of heat resistance and thermal conductivity.

However, when the fluorescent ceramics are excited, their luminous centers are relatively few, resulting in a poor luminous efficiency. For the fluorescent ceramics, how to further improve the luminous efficiency is still the tireless pursuit of the industry.

The primary purpose of the present disclosure is to provide spinel in a multiphase fluorescent ceramic including an alumina matrix and fluorescent particles, the spinel is distributed between alumina grain boundaries, and has a refractive index lower than that of the alumina matrix, and the spinel is used to scatter excitation light irradiated into the multiphase fluorescent ceramic, which is beneficial to further improve the luminous efficiency of the multiphase fluorescent ceramic.

Based on the above-mentioned purposes, the technical solutions in the embodiments of the present disclosure will be described below clearly and completely in conjunction with the accompanying drawings of the embodiments of the present disclosure. It is understandable that the specific embodiments described herein are only used to explain the present disclosure, but not to limit the present disclosure. In the case of no conflict, the following embodiments and their technical features can be combined with each other. In addition, it should be noted that, for ease of description, the drawings only show a part of the structures related to the present disclosure, rather than the entire structures. Based on the embodiments of the present disclosure, all other embodiments obtained by those of ordinary skilled in the art without creative work shall fall within the protection scope of the present disclosure.

Figure 2:
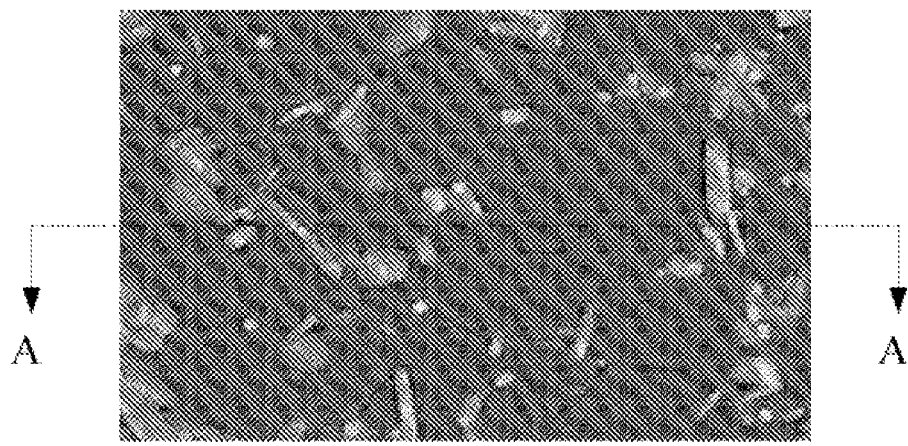
FIG. 2 is a top view of a structure of a multiphase fluorescent ceramic according to an embodiment of the present disclosure.
Figure 3:
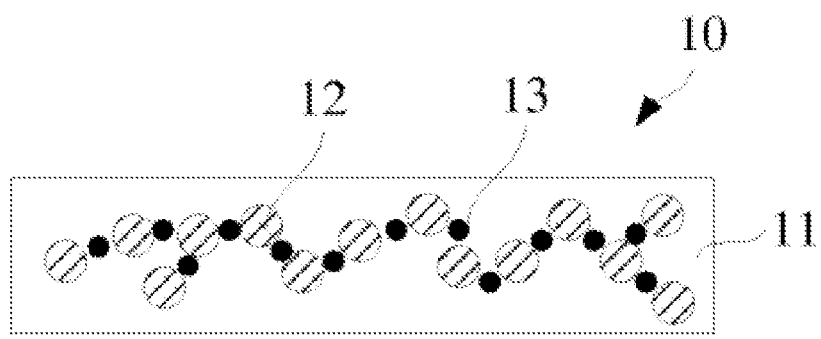
FIG. 3 is a cross-sectional view of a structure of the multiphase fluorescent ceramic shown in FIG. 2 along an A-A direction.

FIG. 2 is a top view of a structure of a multiphase fluorescent ceramic according to an embodiment of the present disclosure, and FIG. 3 is a cross-sectional view of the structure of the multiphase fluorescent ceramic shown in FIG. 2 along an A-A direction. As shown in FIG. 2 and FIG. 3, the multiphase fluorescent ceramic 10 includes an alumina matrix 11, and fluorescent particles 12 and spinel 13 which are distributed in the alumina matrix 11.

The alumina matrix 11 is formed of fine alumina ($Al_2O_3$) crystal grains, the alumina crystal grains can have a size of 1 μm-10 μm, and the alumina matrix 11 with dense and fine crystal grains has good light transmittance.

The fluorescent particles 12 have a size larger than the size of the alumina crystal grains. The diameter D50 of the fluorescent particles 12 is about 2 μm-30 μm. The larger fluorescent particles 12 are evenly distributed in the alumina matrix 11 and are surrounded continuously by the crystal grains of the alumina matrix 11. The fluorescent particles 12 can absorb excitation light. For example, the fluorescent particles 12 can be excited by blue light to emit yellow visible light, and the excited visible light passes through the alumina matrix 11 and exits to the outside of the multiphase fluorescent ceramic 10. Further, the fluorescent particles account for 38%-60% of a total mass.

The size of the spinel 13 is the smallest, and the spinel 13 can be granular, e.g., in some embodiments, with a size of 0.2 μm-2 μm, and the spinel 13 may have a columnar structure, e.g., in some embodiments, with a cross-sectional size of 0.5 μm-2 μm and a length of 2 μm-10 μm. The spinel 13 may account for 0.5% to 5% of a mass of the multiphase fluorescent ceramic 10. Wherein, the spinel 13 can be produced by the sintering reaction of alumina and magnesium-containing oxides (such as magnesium oxide). The alumina and magnesium-containing oxides are generally added in the form of nanoparticles with a particle size of 0.05 μm-0.8 μm. After the sintering, they form magnesia-aluminum spinel particles with a size of 1 μm-5 μm. During the sintering, magnesium oxide solubilizes into the crystal lattice of alumina. The amount of magnesium oxide added (that is, the mass percentage) is generally higher than a solid solution limit of the alumina crystal lattice. That is, in the present disclosure, excessive magnesium oxide is added, and meanwhile, the holding time during sintering is increased, under the condition of which, alumina and magnesium oxide form a magnesia-aluminum spinel phase distributed within the alumina grain boundaries. The resulting second phase (i.e., the magnesia-aluminum spinel phase) can greatly inhibit the growth of the alumina crystal grains, so that the size of the alumina crystal grains in the fluorescent ceramic prepared in the present disclosure is relatively small, which is beneficial to the uniform distribution of the alumina crystal grains.

The spinel 13 with a smaller size is distributed between the alumina grain boundaries in the alumina matrix 11, and has a refractive index lower than the refractive index of the alumina matrix 11.

Figure 1:
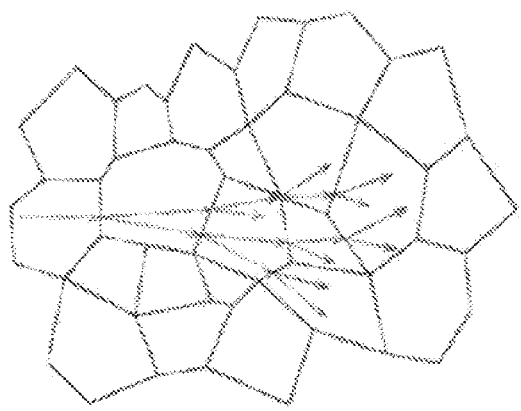
FIG. 1 is a schematic diagram of birefringence of a multiphase fluorescent ceramic.

In the multiphase fluorescent ceramic, the ceramic as the matrix is the first phase, the encapsulated fluorescent power is the second phase, and the fluorescent power of the second phase is evenly distributed in the continuous alumina matrix phase. Since the alumina belongs to trigonal crystal systems, the alumina has a birefringence phenomenon. As shown in FIG. 1, the excitation light will be scattered in the fluorescent ceramic due to the birefringence, and the scattered excitation light in the fluorescent ceramic can then excite more fluorescent powder nearby, showing a higher luminous efficiency. Therefore, the multiphase fluorescent ceramics are more excellent.

In the present disclosure, the spinel 13 is further introduced. A primary role of the spinel 13 is to act as scattering particles for scattering the excitation light incident into the interior of the multiphase fluorescent ceramic 10 and the visible light emitted in the interior of the multiphase fluorescent ceramic 10 under excitation of the excitation light. Therefore, the optical path inside the multiphase fluorescent ceramic 10 is increased, and light propagating from emission centers is not likely to escape laterally through the mediums inside the multiphase fluorescent ceramic 10, the light will be confined within a relatively small region and repeatedly refracted and scattered between different phase media, and more light will eventually escape from the surface of the multiphase fluorescent ceramic 10, thereby enhancing a front emission effect, and thus facilitating further improvement of the luminous efficiency of the multiphase fluorescent ceramic 10. In other words, it is equivalent in the present disclosure that the spinel 13 is added as a scattering phase to the existing multiphase fluorescent ceramic to further improve the luminous efficiency of the multiphase fluorescent ceramic.

In addition, the spinel 13 is distributed between the alumina grain boundaries in the alumina matrix 11, which can also help improve the compactness of the multiphase fluorescent ceramic 10.

In some embodiments, the spinel 13, as the scattering particles, is an aluminum-magnesium spinel, which may be a product of chemical combination of alumina and a magnesium-containing compound during the sintering. The magnesium-aluminum spinel has stable properties and uniform distribution, and thus can play a good scattering effect.

Figure 4:
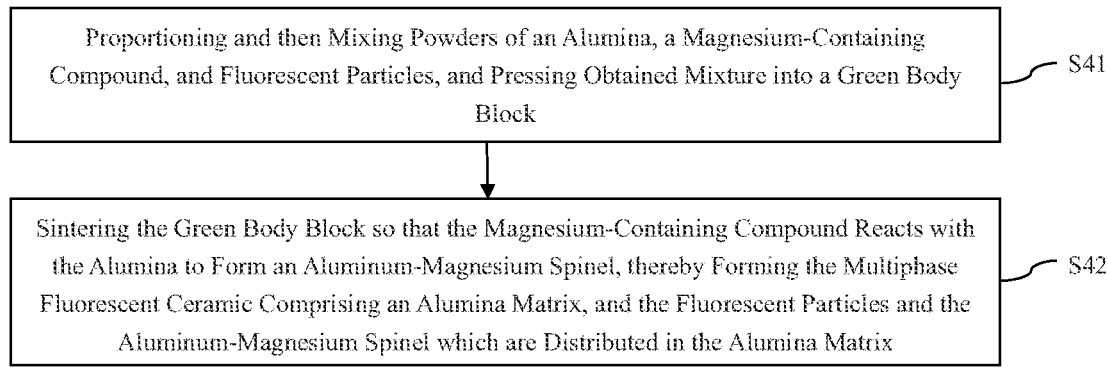
FIG. 4 is a schematic flow chart of a preparation method of a multiphase fluorescent ceramic according to Example 1 of the present disclosure.

In order to obtain the above-mentioned multiphase fluorescent ceramic, the present disclosure also provides a method for preparing the multiphase fluorescent ceramic 10. As shown in FIG. 4, the method includes the following steps:

S41: the powders of an alumina, a magnesium-containing compound, and fluorescent particles were proportioned and then mixed, and the obtained mixture was pressed into a green body block; and S42: the green body block was sintered so that the magnesium-containing compound reacted with the alumina to form an aluminum-magnesium spinel, thereby forming the multiphase fluorescent ceramic including an alumina matrix, and the fluorescent particles and the aluminum-magnesium spinel which are distributed in the alumina matrix.

The preparation methods of the present disclosure are different with respect to different magnesium-containing compounds. For example, the proportions of the alumina, the magnesium-containing compound and the fluorescent particles in the mixture will be different, the pressure required for the pressing, the temperature and time required for vacuum sintering, and the temperature and time of thermal annealing treatment will also be different. Hereinafter, taking the spinel 13 as an aluminum-magnesium spinel as an example, the preparation principle and process of the multiphase fluorescent ceramic 10 of the present disclosure will be described in conjunction with the methods shown in FIGS. 5 to 7.

Example 1

Figure 5:
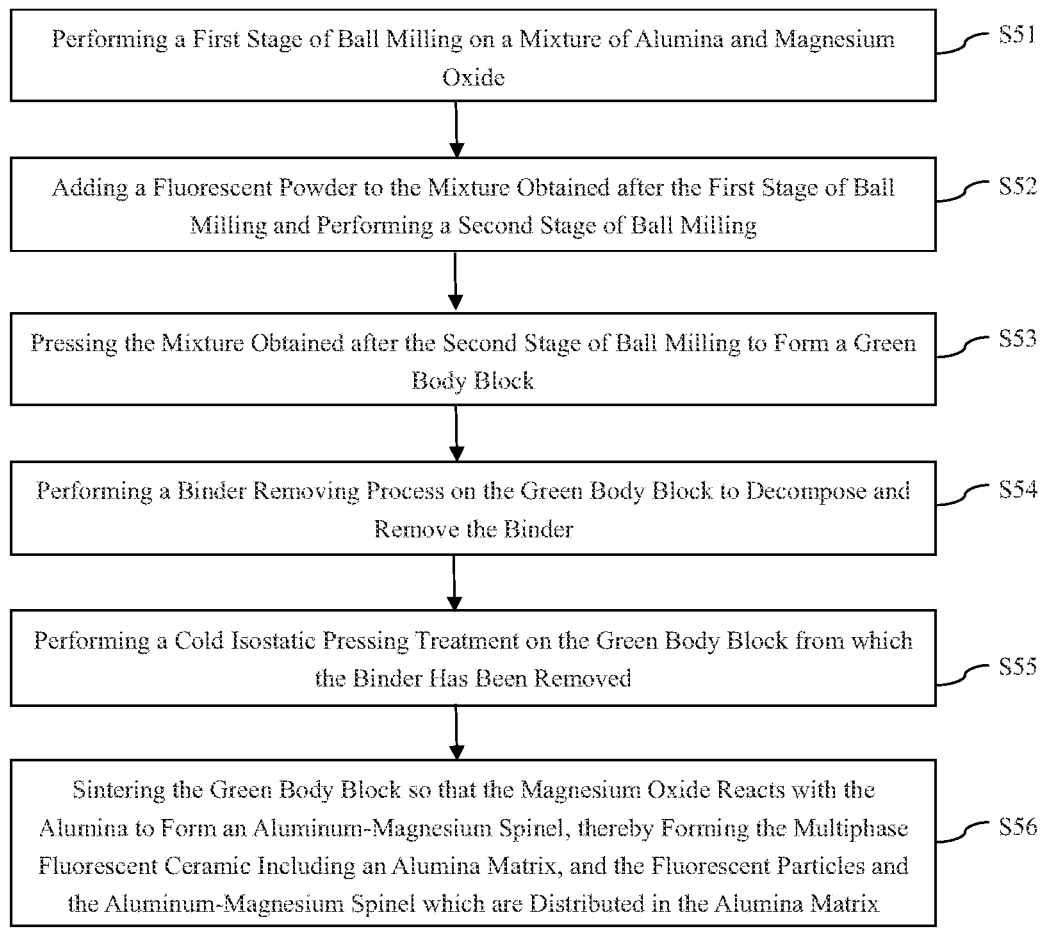
FIG. 5 is a schematic flow chart of a preparation method of a multiphase fluorescent ceramic according to Example 2 of the present disclosure.

Referring to FIG. 5, the preparation method of the multiphase fluorescent ceramic 10 includes the following steps S51 to S56.

At a step S51, a first stage of ball milling was performed on a mixture of alumina and magnesium oxide.

The magnesium-containing compound of this example was magnesium oxide powder.

First, a high-purity nano-grade alumina powder and a magnesium oxide powder were selected, in some embodiments, both of which had a purity of 99% or more, and the magnesium oxide accounted for 2 wt % of a total mass of the powders. Then, the two together with a small amount of anhydrous ethanol were poured into a ball mill tank, where the anhydrous ethanol was used as a dispersant to facilitate uniform mixing of the alumina powder and the magnesium oxide powder during the ball milling process. In the first stage of ball milling, alumina balls were used for ball milling and mixing, and in some embodiments, the duration of the ball milling was 24 hours.

At a step S52, a fluorescent powder was added to the mixture obtained after the first stage of ball milling and a second stage of ball milling was performed.

A certain amount of fluorescent powder, such as Ce:YAG or Ce:LuAG fluorescent powder was weighed, which accounted for 50% of the total mass of the powders, and a certain amount of a solution of PVB (polyvinyl butyral) in ethanol was added as a dispersant. After ball milling for 1 hour, the resulting mixture was vacuum dried at 70° C., then immediately grinded, sieved, and then packaged for later use.

At a step S53, the mixture obtained after the second stage of ball milling was pressed to form a green body block.

The mixture powder was pressed into the green body block under a pressure of 80 MPa.

At step S54, a binder removing process was performed on the green body block to decompose and remove the binder.

At step S55, a cold isostatic pressing treatment was performed on the green body block from which the binder has been removed.

The formed green body block (i.e., fluorescent ceramic green body) was subjected to the binder removing process in a muffle furnace to remove the organic ethanol used as a binder. The binder removing process was performed at 500° C. for a holding time of 2 h and at 900° C. for a holding time of 4 h.

After the binder removing was completed, the fluorescent ceramic green body was subjected to cooling and static pressure treatment under a pressure of 200 MPa to increase the compactness of the fluorescent ceramic green body.

At step S56, the green body block was sintered, so that the magnesium oxide reacted with the alumina to form an aluminum-magnesium spinel, thereby forming the multiphase fluorescent ceramic including an alumina matrix, and the fluorescent particles and the aluminum-magnesium spinel which are distributed in the alumina matrix.

The fluorescent ceramic green body was placed in a vacuum furnace with a vacuum of $10^{-3}$ Pa and sintered at 1700° C. for 4 h. After the vacuum sintering, the fluorescent ceramic green body was annealed at 1300° C. for 10 hours in an air atmosphere. Then, a multiphase fluorescent ceramic with a certain thickness and a rough surface was formed.

In the present disclosure, the multiphase fluorescent ceramic was further thinned, for example, to a thickness of 100 μm or less, and then polished to finally obtain a usable multiphase fluorescent ceramic.

Example 2

Figure 6:
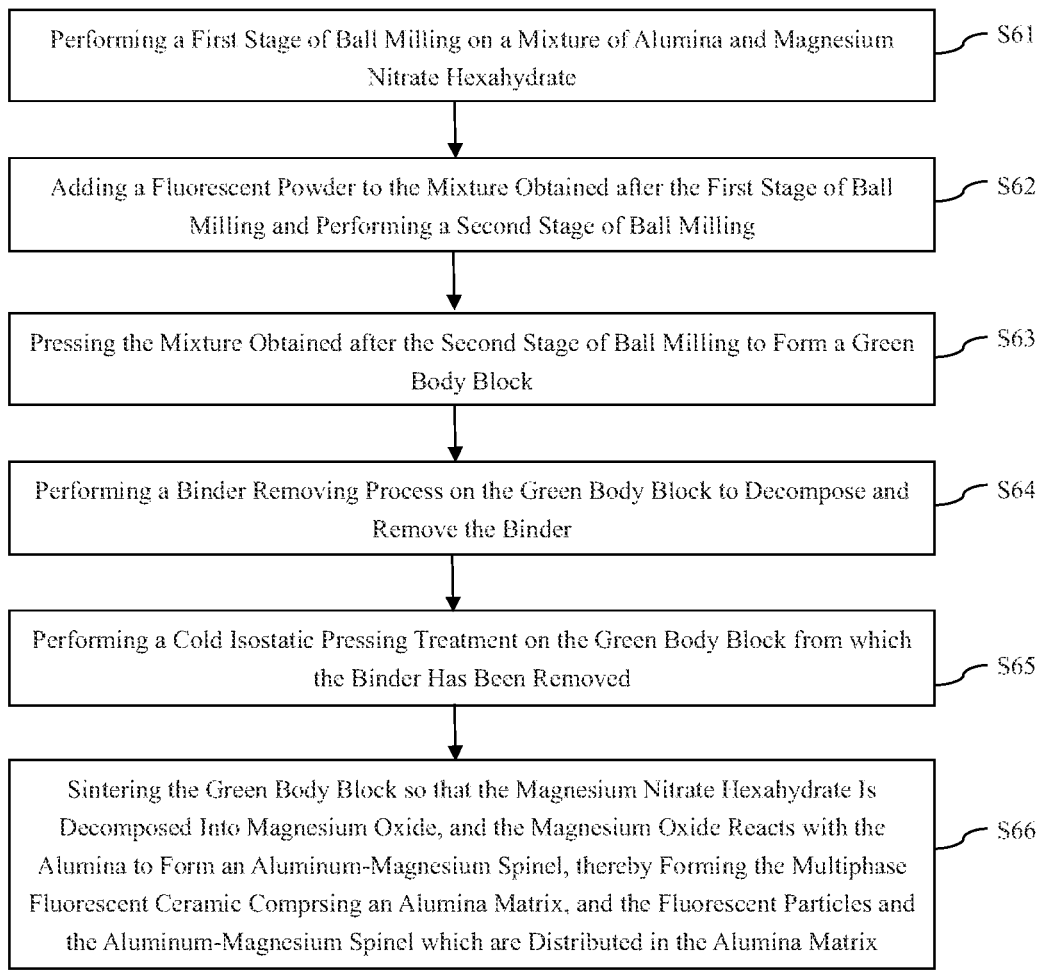
FIG. 6 is a schematic flow chart of a preparation method of a multiphase fluorescent ceramic according to Example 3 of the present disclosure.

Referring to FIG. 6. The preparation method of the multiphase fluorescent ceramic 10 includes the following steps S61 to S66.

At step S61, a first stage of ball milling was performed on a mixture of alumina and magnesium nitrate hexahydrate.

The magnesium-containing compound in this example was magnesium nitrate hexahydrate.

A high-purity nano-grade alumina powder and magnesium nitrate hexahydrate were selected, in some embodiments, both of which had a purity of 99% or more, and the magnesium nitrate hexahydrate accounted for 10 wt % of a total mass of the powders. Then, the two together with a small amount of anhydrous ethanol were poured into a ball mill tank, where the anhydrous ethanol was used as a dispersant to facilitate uniform mixing of the alumina powder and the magnesium nitrate hexahydrate during the ball milling process. In the first stage of ball milling, alumina balls were used for ball milling and mixing, and in some embodiments, the duration of the ball milling was 24 hours.

At step S62, a fluorescent powder was added to the mixture obtained after the first stage of ball milling and a second stage of ball milling was performed.

A certain amount of fluorescent powder, such as Ce:YAG or Ce:LuAG fluorescent powder was weighed, which accounted for 40% of the total powder mass, and a certain amount of a solution of PVB in ethanol was added as a dispersant. After ball milling for 0.5 h, the resulting mixture was vacuum dried at 70° C., then immediately grinded, sieved, and then packaged for later use.

At step S63, the mixture obtained after the second stage of ball milling was pressed to form a green body block.

The mixture powder was pressed into the green body block under a pressure of 80 MPa.

At step S64, a binder removing process was performed on the green body block to decompose and remove the binder.

At step S65, a cold isostatic pressing treatment was performed on the green body block from which the binder has been removed.

The formed green body block (i.e., fluorescent ceramic green body) was subjected to the binder removing process in a muffle furnace to remove the organic ethanol therein. The binder removing process was performed at 500° C. for a holding time of 2 h and at 1000° C. for a holding time of 6 h.

After the binder removing was completed, the fluorescent ceramic green body was subjected to cooling and static pressure treatment under a pressure of 200 MPa to increase the compactness of the fluorescent ceramic green body.

At step S66, the green body block was sintered, so that the magnesium nitrate hexahydrate was decomposed into magnesium oxide, and the magnesium oxide reacted with the alumina to form an aluminum-magnesium spinel, thereby forming the multiphase fluorescent ceramic including an alumina matrix, and the fluorescent particles and the aluminum-magnesium spinel which are distributed in the alumina matrix.

The fluorescent ceramic green body was placed in a vacuum furnace with a vacuum of $10^{-3}$ Pa and sintered at 1730° C. for 4 h. After the vacuum sintering, the fluorescent ceramic green body was annealed at 1350° C. for 10 hours in an air atmosphere. Then, a multiphase fluorescent ceramic with a certain thickness and a rough surface was formed.

In the present disclosure, the multiphase fluorescent ceramic was further thinned, for example, to a thickness of 100 μm or less, and then polished to finally obtain a usable multiphase fluorescent ceramic.

Example 3

Figure 7:
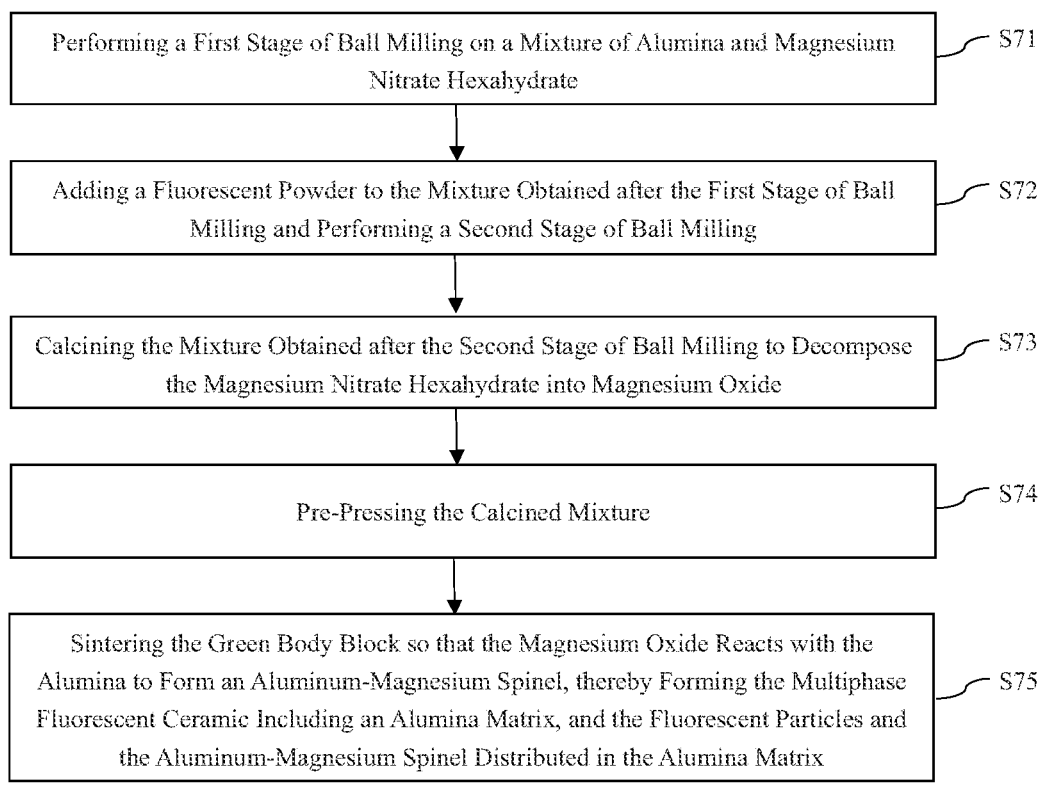
FIG. 7 is a schematic flow chart of a preparation method of a multiphase fluorescent ceramic according to Example 4 of the present disclosure.

Referring to FIG. 7. The preparation method of the multiphase fluorescent ceramic 10 includes the following steps S71 to S76.

At step S71, a first stage of ball milling was performed on a mixture of alumina and magnesium nitrate hexahydrate.

The magnesium-containing compound in this example was magnesium nitrate hexahydrate.

A high-purity nano-grade alumina powder and magnesium nitrate hexahydrate nitrate were selected, in some embodiments, both of which had a purity of 99% or more, and the magnesium nitrate hexahydrate accounted for 8 wt % of a total mass of the powders. Then, the two together with a small amount of anhydrous ethanol were poured into a ball milling tank, where the anhydrous ethanol was used as a dispersant to facilitate uniform mixing of the alumina powder and the magnesium nitrate hexahydrate during the ball milling process. In the first stage of ball milling, alumina balls were used for ball milling and mixing, and in some embodiments, the duration of the ball milling was 24 hours.

At step S72, a fluorescent powder was added to the mixture obtained after the first stage of ball milling and a second stage of ball milling was performed.

A certain amount of fluorescent powder, such as Ce:YAG or Ce:LuAG fluorescent powder was weighed, which accounted for 60% of the total powder mass. After ball milling for 0.5 h, the mixture was vacuum dried at 70° C., then immediately grinded, sieved, and then packaged for later use.

At step S73, the mixture obtained after the second stage of ball milling was calcined to decompose the magnesium nitrate hexahydrate into magnesium oxide.

The powder after sieving was calcined in a muffle furnace at a temperature between 500° C. and 700° C. for 2 h-5 h to remove organic components in the powder, and decompose the magnesium nitrate hexahydrate into magnesium oxide. After calcination, the powder was grinded and sieved through a 200-mesh sieve to obtain a powder with better fluidity, and then the powder was packaged for later use.

At step S74: the calcined mixture was pre-pressed.

The mixture powder was filled into a graphite mold, and pre-pressed under a pressure of 5 MPa-20 MPa.

At step S75, the green body block was sintered, so that the magnesium oxide reacted with the alumina to form an aluminum-magnesium spinel, thereby forming the multiphase fluorescent ceramic including an alumina matrix, and the fluorescent particles and the aluminum-magnesium spinel which are distributed in the alumina matrix.

The graphite mold was placed in a spark plasma sintering (SPS) hot press furnace, in a vacuum/argon atmosphere, and sintered at 1300-1600° C. with heat preservation for 0.5 h to 4 h under a pressure of 20 MPa-180 MPa. After the hot press sintering, the fluorescent ceramic green body was annealed at 1300° C. for 10 hours in an air atmosphere to form a multiphase fluorescent ceramic with a certain thickness and a rough surface.

In the present disclosure, the multiphase fluorescent ceramic was further thinned, for example, to a thickness of 100 μm or less and then polished to finally obtain a usable multiphase fluorescent ceramic.

The above-mentioned multiphase fluorescent ceramics 10 can be used as light-emitting elements of various types of display panels, including but not limited to organic light-emitting diode (OLED) display panels, or flexible touch display panels. In addition, the display panel can be applied to mobile terminals such as smart phones and PDAs (Personal Digital Assistants, or tablet computers), as well as wearable devices that are worn on limbs or embedded in clothing, jewelry, and accessories, which are not limited herein.

It should be understood that the terms "first" and "second" in the present disclosure are only used for descriptive purposes, and cannot be understood as indicating or implying relative importance or implicitly indicating the number of indicated technical features. Therefore, the features defined with "first" and "second" may explicitly or implicitly include at least one of the features. "Plurality" means at least two, such as two, three, etc., unless otherwise specifically defined. All directional indicators (such as up, down, left, right, front, back . . . ) in the embodiments of the present disclosure are only used to explain the relative positional relationship, movement situation, etc., between the various components in a specific posture (as shown in the drawings), and if the specific posture changes, the directional indication will also change accordingly.

Again, the above are only the embodiments of the present disclosure, and do not limit the scope of the present disclosure. Any equivalent structure or equivalent process variation made using the content of the description and drawings of the present disclosure, such as combination of technical features between the various embodiments, or direct or indirect application in other related technical fields, are included in the protection scope of the present disclosure for the same reason.

The invention claimed is:

1. A multiphase fluorescent ceramic, comprising an alumina matrix, and fluorescent particles and spinel which are distributed in the alumina matrix, wherein the spinel is distributed within the alumina grain boundaries in the alumina matrix.

2. The multiphase fluorescent ceramic according to claim 1, wherein the spinel has a structure of a granule, and has a grain size of 0.2 μm-2 μm.

3. The multiphase fluorescent ceramic according to claim 1, wherein the spinel accounts for 0.5% to 5% of a mass of the multiphase fluorescent ceramic.

4. The multiphase fluorescent ceramic according to claim 1, wherein the fluorescent particles account for 38%-60% of a total mass.

5. The multiphase fluorescent ceramic according to claim 1, wherein the fluorescent particles have a diameter of 2 μm-30 μm, and wherein grains of the alumina have a size of 1 μm-10 μm.

6. The multiphase fluorescent ceramic according to claim 1, wherein the spinel has a structure of a column, and has a cross-sectional size of 0.5 μm-2 μm and a length of 2 μm-10 μm.

7. The multiphase fluorescent ceramic according to claim 1, wherein the spinel is magnesia-aluminum spinel with a particle size of 1 µm-5 µm.

8. The multiphase fluorescent ceramic according to claim 1, wherein the alumina matrix is formed of alumina crystal grains, wherein the spinel has a smaller size than fluorescent particles and the alumina crystal grains, and the spinel is distributed within the alumina grain boundaries in the alumina matrix, and wherein the spinel has a refractive index lower than the refractive index of the alumina matrix.

9. The multiphase fluorescent ceramic according to claim 1, wherein the fluorescent particles are evenly distributed in the alumina matrix, and wherein the matrix forms a continuous phase.

10. A preparation method of a multiphase fluorescent ceramic, comprising:
proportioning and then mixing powders of alumina, a magnesium-containing compound, and fluorescent particles, and pressing obtained mixture into a green body block; and
sintering the green body block in such a manner that the magnesium-containing compound reacts with the alumina to form aluminum-magnesium spinel, thereby forming the multiphase fluorescent ceramic comprising an alumina matrix, and the fluorescent particles and the aluminum-magnesium spinel which are distributed in the alumina matrix.

11. The preparation method according to claim 10, wherein the powders of the magnesium-containing compound and the alumina have a diameter of 0.05 µm-0.8 µm.

12. The preparation method according to claim 10, wherein the magnesium-containing compound is magnesium oxide or magnesium nitrate hexahydrate.

13. The preparation method according to claim 12, further comprising: calcining the mixed powders to decompose magnesium nitrate hexahydrate into magnesium oxide and remove organic components, and pressing a power obtained by grinding and sieving the calcined components to form the green body block.

14. The preparation method according to claim 12, wherein the magnesium oxide accounted for 2 wt % of a total mass of the powders, and wherein the magnesium nitrate hexahydrate accounted for 8 wt % or 10 wt % of a total mass of the powders.

15. The preparation method according to claim 10, wherein a binder is mixed in the powders when the powders are mixed, and wherein the method further comprise: prior to the sintering of the green body block, performing a binder removing process to decompose and remove the binder.

16. The preparation method according to claim 15, further comprising: prior to the sintering of the green body block from which the binder has been removed, subjecting the green body block from which the binder has been removed to cold isostatic pressing treatment.

17. The preparation method according to claim 10, wherein the fluorescent particles account for 38%-60% of a total mass of the powders, and wherein the aluminum-magnesium spinel accounts for 0.5% to 5% of a mass of the prepared multiphase fluorescent ceramic.

18. The preparation method according to claim 10, wherein the fluorescent particle is Ce:YAG or Ce:LuAG.

19. The preparation method according to claim 10, wherein the amount of the magnesium-containing compound is higher than a solid solution limit of the alumina crystal lattice.

20. The preparation method according to claim 10, wherein the aluminum-magnesium spinel has a particle size of 1 µm-5 µm.

* * * * *